(12) United States Patent
Krueger et al.

(10) Patent No.: US 6,998,320 B2
(45) Date of Patent: Feb. 14, 2006

(54) PASSIVATION LAYER FOR GROUP III-V SEMICONDUCTOR DEVICES

(75) Inventors: Martha R. Krueger, Allen, TX (US); Andrew N. MacInnes, Allen, TX (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 275 days.

(21) Appl. No.: 10/422,201

(22) Filed: Apr. 23, 2003

(65) Prior Publication Data

US 2004/0214401 A1 Oct. 28, 2004

(51) Int. Cl.
*H01L 21/00* (2006.01)

(52) U.S. Cl. .................................................. 438/312
(58) Field of Classification Search .......... 438/312–321
See application file for complete search history.

(56) References Cited

U.S. PATENT DOCUMENTS 3,993,506 A * 11/1976 Moon .......................... 136/262
5,322,573 A * 6/1994 Jain et al. .................... 136/252

OTHER PUBLICATIONS

Kikawa et al.; "Passivation Of InP-Based Heterostructure Bipolar Transistors-Relation To Surface Fermi Level", $10^{th}$ Intern. Conf. on Indium Phosphide and Related Materials, May 11–15, 1998 Tsukuba, Japan.

Wang et al., "Understanding The Degradation Of InP/GaAs Heterojunction Bipolar Transistors Induced By Silicon Nitride Passivation", 2001 International Conference on Indium Phosphide and Related Materials Conference Prodeedings $13^{th}$ IPRM May 14–18, 2001 Nara, Japan.

* cited by examiner

*Primary Examiner*—Richard A. Booth
(74) *Attorney, Agent, or Firm*—Bever Hoffman & Harms

(57) ABSTRACT

A passivation layer for a heterojunction bipolar transistor (HBT) is formed from a relatively high bandgap material that is lattice-matched to the HBT components it passivates. By selecting the passivation layer to have a higher bandgap than the HBT components, minority carriers are contained within the HBT by the passivation layer. At the same time, the lattice matching of the passivation layer ensures a robust bond that prevents the subsequent formation of dangling bonds at the exterior surfaces of the base and collector (and/or other passivated surfaces), thereby minimizing surface leakage currents.

11 Claims, 15 Drawing Sheets

PASSIVATION LAYER FOR GROUP III-V SEMICONDUCTOR DEVICES

BACKGROUND OF THE INVENTION

1. Field of the Invention

The invention relates to the field of semiconductor devices, and in particular to a method and structure for preventing excess base-collector leakage currents in heterojunction bipolar transistors.

2. Relevant Art

A heterojunction bipolar transistor (HBT) is a bipolar transistor that includes at least two semiconductor materials that have different bandgap values. The bandgap differential controls the flow of minority carriers within the HBT to provide the desired transistor functionality. By using different semiconductor materials, HBTs can overcome the performance limitations associated with conventional single-material bipolar junction transistors (BJTs).

FIG. 1A shows a cross sectional view of a conventional HBT 101. HBT 101 includes a subcollector 111 formed on a substrate 100, a collector 121 formed on subcollector 111, a base 131 formed on collector 121, and an emitter 141 formed on base 131. The top of emitter 141 includes an emitter cap 151 for improved electrical conductivity to emitter 141.

HBT 101 is in a "wired" state, with interconnects 113, 133, and 153 providing electrical connectivity to contacts 112, 132, and 153, respectively, formed on subcollector 111, base 131, and emitter cap 151.

HBT 101 can either be a single heterojunction bipolar transistor (SHBT) or a double heterojunction bipolar transistor (DHBT), depending on the material used for the various transistor components. For example, an SHBT could comprise an indium gallium arsenide (InGaAs) base 131 and collector 121, and an indium phosphide (InP) emitter 141, thereby forming a heterojunction between the emitter and the base. A DHBT could be formed by changing collector 121 from InGaAs to InP, thereby creating another heterojunction between base 131 and collector 121. The second heterojunction allows additional bandgap engineering to be performed to further enhance device performance.

An oxide ($SiO_2$) passivation layer 160 is formed over the exterior surfaces of HBT 101 (i.e., the surfaces of emitter 141, base 131, collector 121, optional emitter cap 151, and subcollector 111 not in contact with each other). Nitride ($Si_3N_4$) is also commonly used as a passivation layer. Passivation layer 160 protects HBT 101 from damage and contamination.

Another critical function provided by passivation layer 160 is to minimize problematic base-collector (B-C) surface leakage currents. B-C surface leakage currents arise when dangling (unpassivated) bonds on the exterior surfaces of base 131 and collector 121 create current paths along those exterior surfaces. The B-C surface leakage can result in excess power consumption and degraded device performance for HBT 101.

Unfortunately, conventional passivation layers, such as passivation layer 160, are not optimized for HBTs. As is known in the art, the use of silicon dioxide or silicon nitride to passivate an HBT allows B-C surface leakage currents to increase as the HBT is exposed to temperature cycling (see H. Wang, et al., Proc. 13$^{th}$ IPRM, May 2001, pp. 252–255 and T. Kikaws et al., Proc. 10$^{th}$ IPRM, May 1998, pp. 76–79.). This B-C surface leakage current increase is due in large part to thermally induced strain-related defects that form in the bond between the passivation layer and the underlying HBT components.

FIG. 1B is a representation of a B-C passivation portion 161 of passivation layer 160 shown in FIG. 1A. The atoms forming base 131 are depicted as white dots in a base lattice 131-L. The underlying atoms forming collector 121 are depicted as black dots in a collector lattice 121-L. And the atoms forming passivation layer 160 are depicted as white squares in a passivation layer lattice 160-L. The atoms in base lattice 131-L and the atoms in collector lattice 121-L are all spaced by the same bond length ("lattice constant"), and so base lattice 131-L and collector lattice 121-L are "lattice matched". Typically, the materials in the base, collector, and emitter of an HBT must be lattice-matched to ensure good performance.

However, an oxide or nitride layer will generally have a much smaller lattice constant than the materials used to form the HBT components. As shown in FIG. 1B, the atoms in passivation layer lattice 160-L are more closely spaced than the atoms in base lattice 131-L and collector lattice 121-L, resulting in "lattice mismatch".

Lattice mismatch creates a significant strain at the interface between the mismatched materials, so that thermal cycling can cause bond dislocations and the dangling bonds that provide pathways for surface B-C leakage currents. Thus, conventional passivation techniques result in reduced HBT lifetime and degraded HBT performance.

Accordingly, it is desirable to provide a method and structure for passivating HBTs that minimizes B-C surface leakage currents even after the HBT is exposed to high temperatures.

SUMMARY OF THE INVENTION

The invention involves the passivation of a group III-V device using a lattice-matched, relatively high bandgap material layer, rather than a layer of oxide or nitride. By covering the group III-V device with a passivation material having a bandgap higher than the underlying materials, charge carriers are contained within those underlying materials to ensure proper device performance. At the same time, the use of a lattice-matched material creates a robust bond at the passivation interface that minimizes bond failure (e.g., the creation of dangling bonds) during thermal cycling, thereby minimizing surface leakage currents. In this manner, a lattice-matched, high bandgap passivation material can maintain both the performance and long-term durability of a group III-V device.

According to various embodiments of the invention, the group III-V device can comprise a diode or transistor, such as a HBT. The invention can be used with any type of group III-V material structure that would benefit from reduced surface leakage current. According to various exemplary embodiments of the invention, the total coverage provided by the lattice-matched, high bandgap passivation layer can include the entire structure, or just subportions of the structure, such as the exterior surfaces of the base and collector in a HBT.

The invention will be more fully understood in view of the following description of the exemplary embodiments and the drawings thereof.

DETAILED DESCRIPTION

Figure 1A:
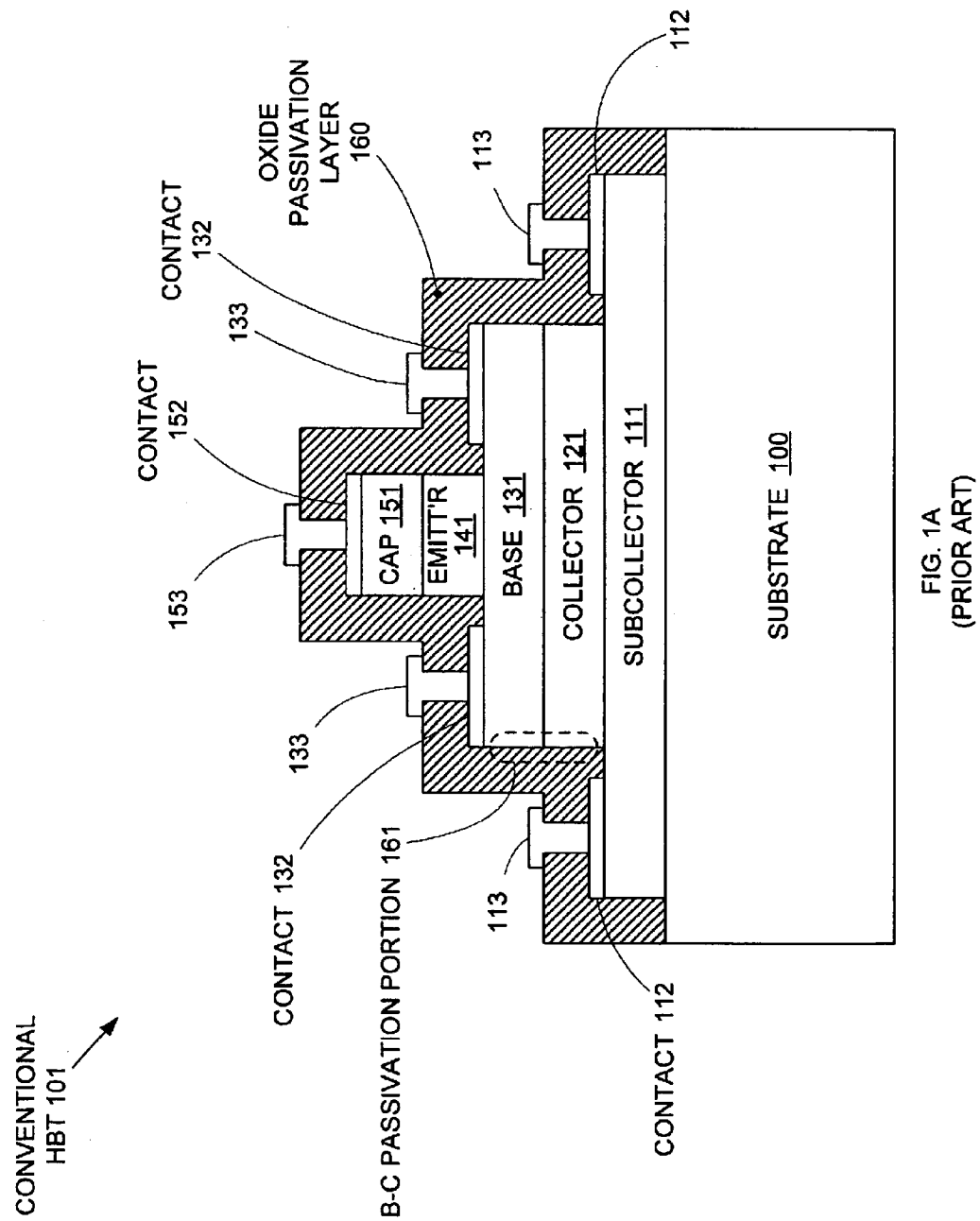
FIG. 1A is a cross sectional view of a conventional HBT passivated by a conventional passivation layer.
Figure 1B:
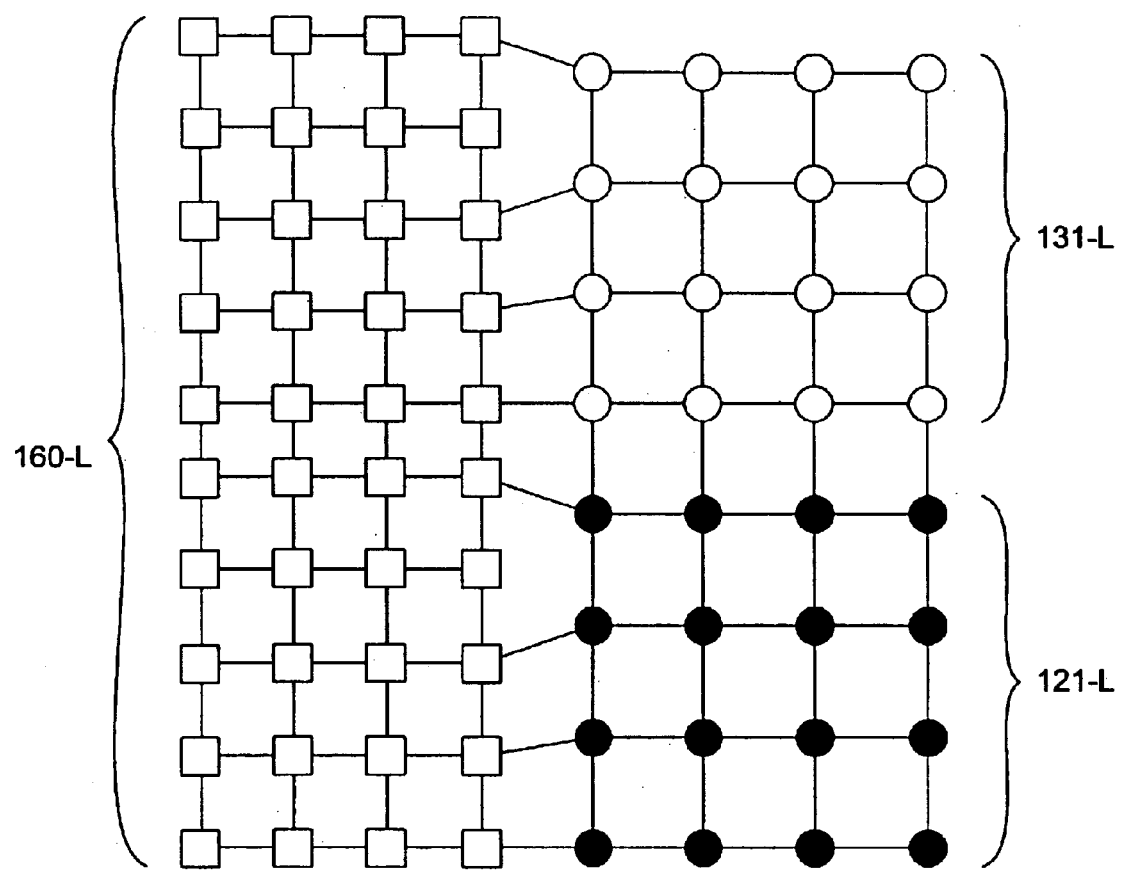
FIG. 1B is a detail view of bonds among and between the conventional passivation layer of FIG. 1A and the underlying base and collector of the HBT.
Figure 2A:
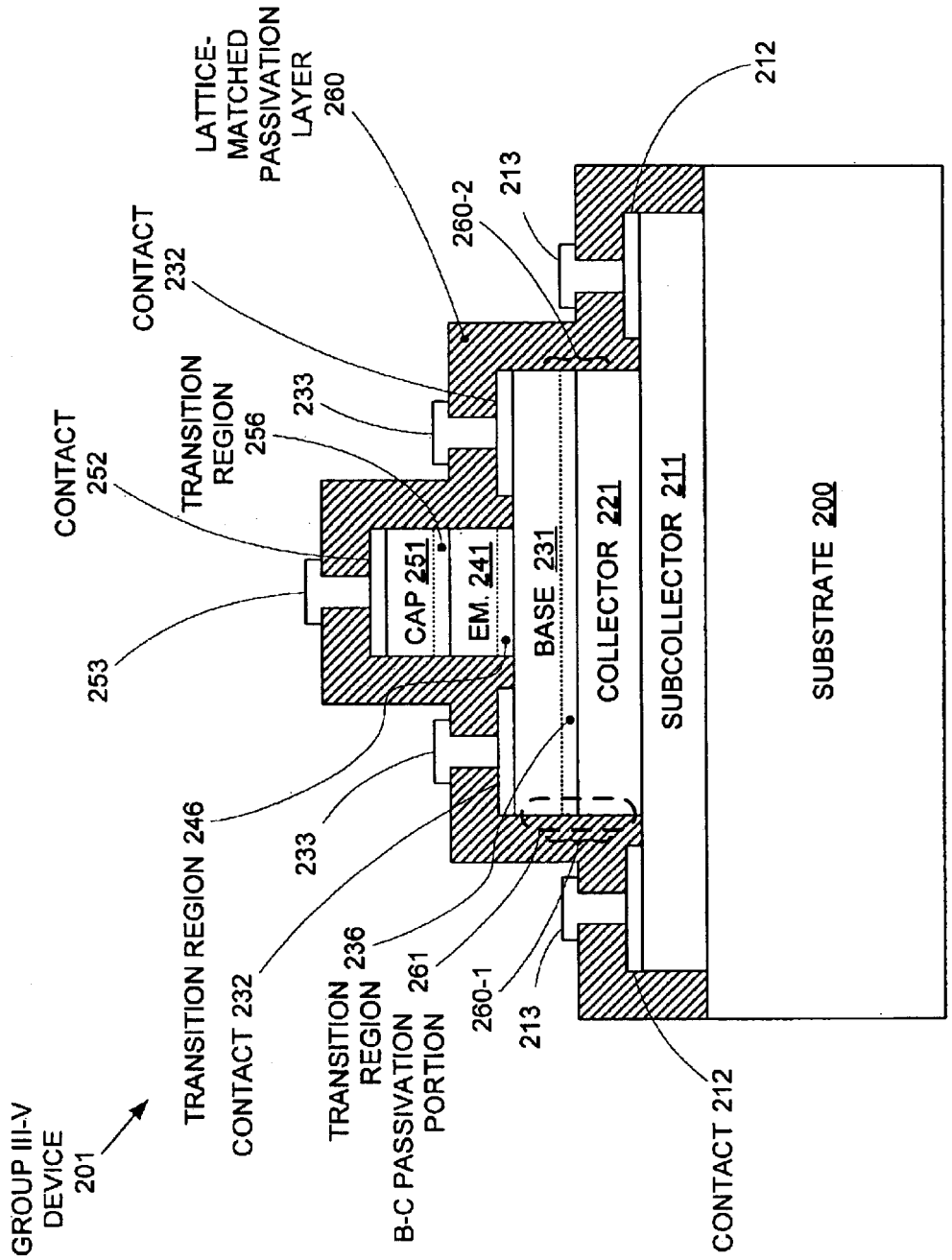
FIG. 2A is a cross sectional view of a semiconductor device passivated by a lattice-matched, high bandgap passivation layer in accordance with an exemplary embodiment of the invention.

FIG. 2A shows a cross sectional view of a group III-V device 201 in accordance with an exemplary embodiment of the invention. Note that while group III-V device 201 is depicted as a HBT for explanatory purposes, the passivation layer of the invention can be applied to any group III-V device. Group III-V devices are devices such as diodes, HBTs, and FETs that are formed from group III-V compound semiconductors (i.e., materials that include group III elements such as aluminum (Al), gallium (Ga), and indium (In) and group V elements such as phosphorous (P), arsenic (As), and antimony (Sb)). Note that due to the high sensitivity of semiconductor devices to device chemistry, processes and techniques developed for other semiconductor types (e.g., non-compound semiconductors such as silicon or non-group III-V compound semiconductors such as silicon germanium) are typically not directly applicable to group III-V devices.

Device 201 is formed on a substrate 200 and includes an emitter 241 formed on a base 231, which in turn is formed on a collector 221. Emitter 241 includes an optional emitter cap 251 that provides a lower-resistance contact region for emitter 241, while an optional subcollector 211 under collector 221 provides improved electrical contact to collector 221. Emitter cap 251, emitter 241, and base 231 can also include optional transition regions 256, 246, and 236, respectively. Transition regions 256, 246, and 236 can comprise various transition layers (such as spacers, doping grades, bandgap grades, and setback layers) for improving or adjusting the performance of device 201.

Device 201 is wired by interconnects 213, 233, and 253, which provide electrical connections to collector 221 (via optional subcollector 211, if present), base 231, and emitter 341 (via optional emitter cap 251, if present), respectively. According to an exemplary embodiment of the invention, metal contacts 212, 232, and 252 can be formed directly on subcollector 211, base 231, and emitter cap 251, respectively, if the metal can withstand the passivation process temperatures.

Device 201 is passivated by a lattice-matched passivation layer 260 that has relatively high bandgap compared to the components in device 201. Lattice-matched passivation layer 260 can comprise any material that can be lattice-matched to the underlying device components (collector, base, and emitter), and has a higher (wider) bandgap than those underlying device components. The higher bandgap of passivation layer 260 contains minority carriers within the components of the device to ensure proper functionality of device 201. Meanwhile, the lattice-matching of passivation layer 260 creates a robust bond that prevents the formation of current pathways that would allow the flow of surface leakage currents (e.g., B-C surface leakage currents).

For example, according to an exemplary embodiment of the invention, an InP HBT (i.e., a HBT that includes an InP emitter) can be passivated by an indium aluminum arsenide (InAlAs) passivation layer. InAlAs has a bandgap of approximately 1.46 eV, which is significantly higher than typical InP HBT component materials. For example, a common InP HBT construction includes an InP emitter and collector surrounding an indium gallium arsenide (InGaAs) base (for an SHBT, both the base and collector would be InGaAs). InP has a bandgap of approximately 1.35 eV and InGaAs has a bandgap of approximately 0.75 eV. Therefore, minority carriers in the device components will not be able to easily pass through the passivation layer, so that the desired transistor operation of the HBT is ensured.

Figure 2B:
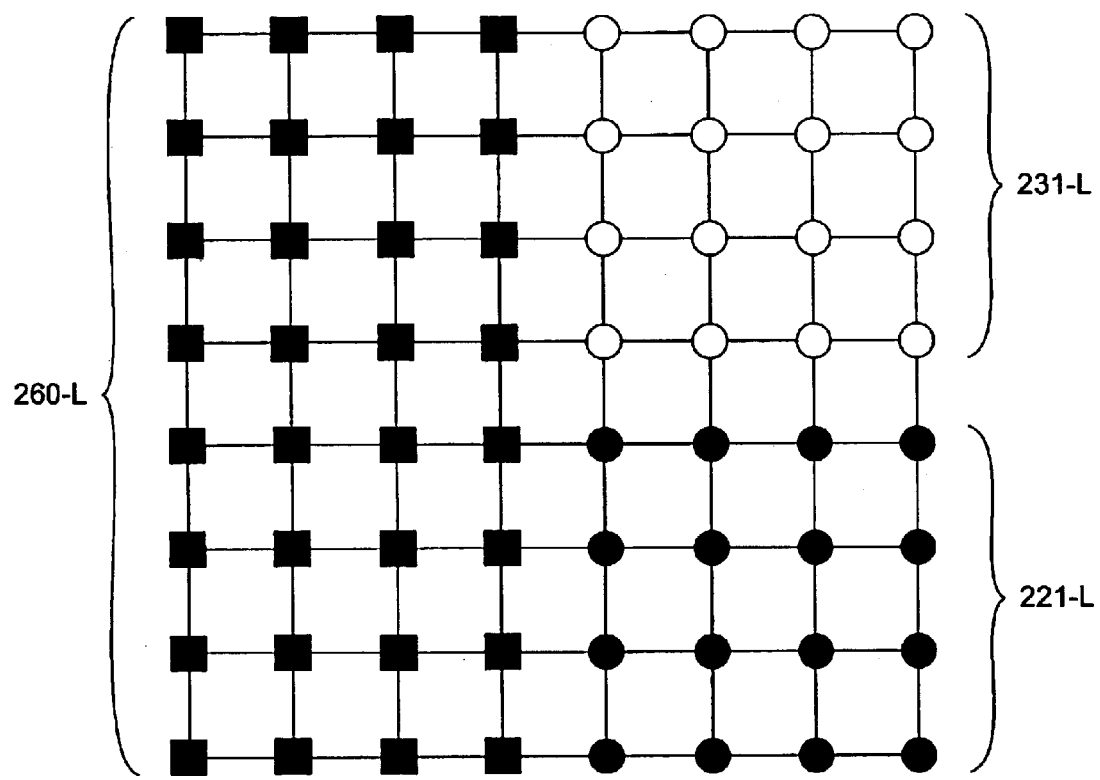
FIG. 2B is a detail view of bonds among and between the lattice-matched, high bandgap passivation layer of FIG. 2A and the underlying base and collector of the semiconductor device.

InAlAs also has a lattice constant that is very similar to the lattice constant of standard InP device materials (such as InP and InGaAs), and so can be readily lattice-matched to those materials. FIG. 2B is a representation of a B-C passivation portion 261 of passivation layer 260 shown in FIG. 2A. The atoms forming base 231 are depicted as white dots in a base lattice 231-L. The atoms forming underlying collector 221 are depicted as black dots in a collector lattice 221-L. The atoms forming lattice-matched passivation layer 260 are depicted as black squares in a passivation layer lattice 260-L.

Because the lattice constant in passivation layer lattice 260-L closely matches the lattice constants of base lattice 231-L and collector lattice 221-L, passivation layer 260 is lattice-matched to base 231 and collector 221. This results in a very low strain bond between passivation layer 260 its underlying components, so that the likelihood of dangling bond formation at the exterior surfaces of base 231 and collector 221 is minimized. This lack of dangling bonds means that no current pathways exist along the surfaces of base 231 and collector 221, so that B-C surface leakage currents in device 201 can be prevented.

Returning to FIG. 2A, note that device 201 will typically be passivated as a whole in a single passivation operation, in which case lattice-matched passivation layer 260 would fully cover device 201 as shown. However, for the prevention of B-C surface leakage currents in device 201, only the exterior surfaces of base 231 and collector 221 need be passivated with the lattice-matched high bandgap passivation layer.

Therefore, according to another exemplary embodiment of the invention, only those exterior surfaces of base 231 and collector 221 that surround the interface between base 231 and collector 221 need be passivated by lattice-matched passivation layer 260, as indicated by regions 260-1 and 260-2 in FIG. 2A. The remainder of device 201 could then be passivated using any other passivation means.

For example, device 201 could comprise an InAlAs HBT (i.e., a HBT having an InAlAs emitter), in which case regions 260-1 and 260-2 could be passivated by an InAlAs passivation layer, while emitter 241 (and cap 251, if present) could be passivated by another material—for example, a standard oxide passivation layer. Thus, the particular surfaces passivated by lattice-matched passivation layer can be selected according to the particular requirements of the device being passivated.

FIGS. 3A–3E depict various stages in a process for creating device 201 shown in FIG. 2A, according to an exemplary embodiment of the invention. Note once again that although a HBT formation process is described for exemplary purposes, the passivation layer of the invention can beneficially be applied to any group III-V device.

Figure 3A:
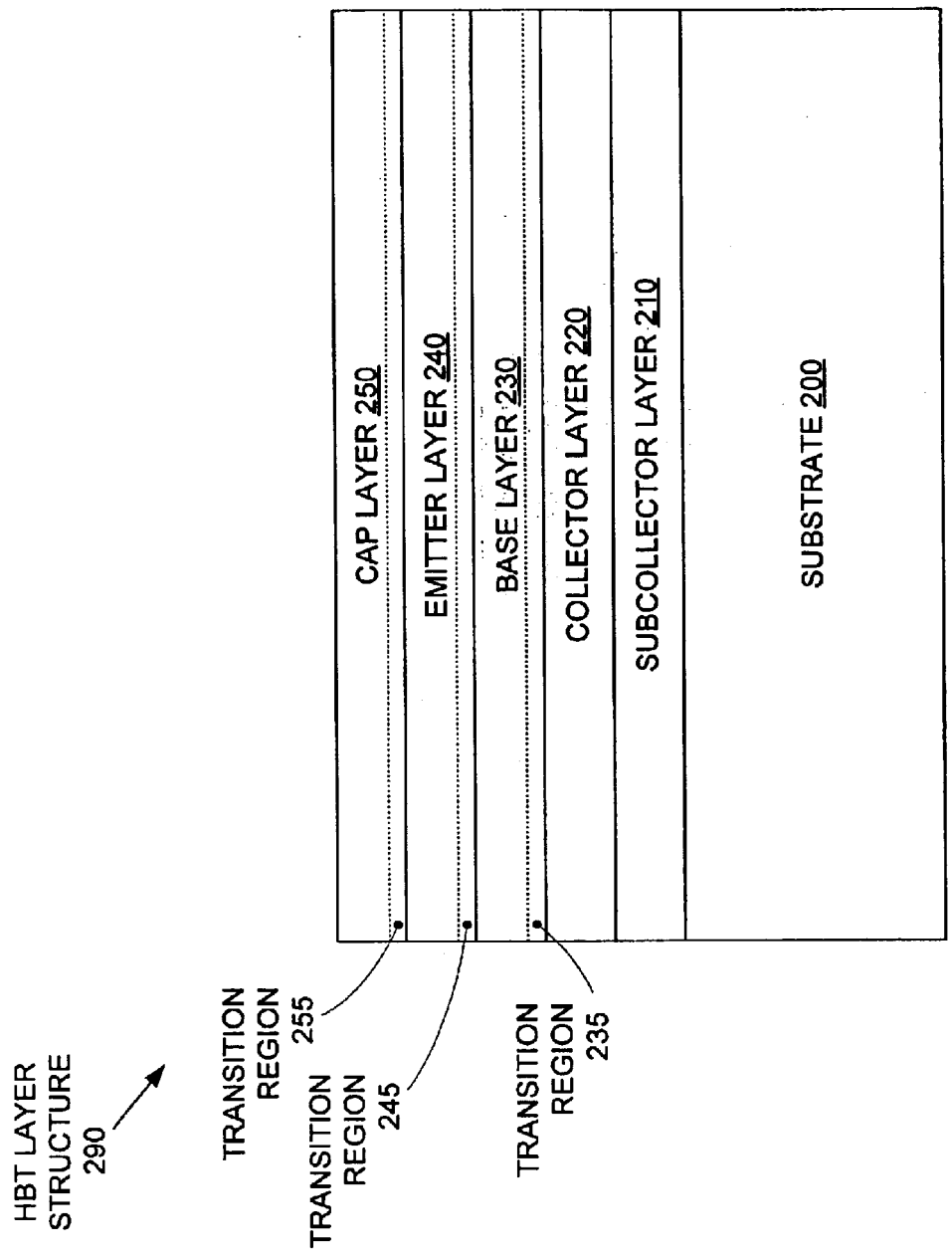
FIGS. 3A, 3B, 3C, 3D, and 3E are cross sectional views of different stages in a manufacturing process for an HBT having a lattice-matched, high-bandgap passivation layer, according to an embodiment of the invention.

FIG. 3A shows an example HBT layer structure 290, from which the final HBT will be formed. HBT layer structure 290 includes a substrate 200, an optional subcollector layer 210 formed on substrate 200, a collector layer 220 formed on subcollector layer 210, a base layer 230 formed on collector layer 220, an emitter layer 240 formed on base layer 230, and an optional cap layer 250 formed on emitter layer 240.

Note that, for exemplary purposes, emitter layer 240 is depicted as being formed above base layer 230, which in turn is depicted as being formed above collector layer 220. This arrangement results in a final device in which the emitter is above the base, which is above the collector.

According to other exemplary embodiments of the invention, the order of the layers in device layer structure 290 could be reversed, so that collector layer 220 would be formed above base layer 230, which in turn would be formed above emitter layer 240, which would result in a final device having the collector above the base, which would be above the emitter.

Note further that cap layer 250, emitter layer 240, and base layer 230 can include optional transition regions 255, 245, and 235, respectively. Transition regions 255, 245, and 235 can include various transition layers (such as spacer, doping grade, bandgap grade, and n and p setback layers) that improve or adjust the characteristics of the final device. For example, a doping grade layer is often included between an emitter cap and an emitter to reduce conduction band blocking, thereby improving conductivity. Also, since the base of a HBT is often highly doped, a spacer layer is sometimes used to prevent outdiffusion of the base dopant atoms into neighboring structures.

Table 1 provides an example material listing for device layer structure 290 that includes various types of transition layers, according to an exemplary embodiment of the invention.

TABLE 1

Sample HBT Layer Structure 290

| Layer | Detail | Material | Doping (cm$^{-3}$) | Thk. (A) |
|---|---|---|---|---|
| Cap Layer 350 | | InGaAs | Si: $1 \times 10^{19}$ | 600 |
| Transition Region 355 | Doping Grade | InP | Si: $6 \times 10^{19}$ | 100 |
| Emitter Layer 340 | | InP | Si: $5 \times 10^{17}$ | 500 |
| Transition Region 345 | Spacer | InGaAs | Si: $1 \times 10^{19}$ | 80 |
| Base Layer 330 | | InGaAs | p: $1 \times 10^{19}$ | 900 |
| Transition Region 335 | p Setback | InGaAs | p: $2 \times 10^{18}$ | 80 |
| | n Setback | InGaAs | Si: $3 \times 10^{16}$ | 80 |
| | Bandgap Grade | InGaAlAs | Si: $3 \times 10^{16}$ | 300 |

TABLE 1-continued

Sample HBT Layer Structure 290

| Layer | Detail | Material | Doping (cm$^{-3}$) | Thk. (A) |
|---|---|---|---|---|
| Collector Layer 320 | | InP | Si: $1 \times 10^{16}$ | 7000 |
| Subcollector Layer 310 | Subcollector-1 | InGaAs | Si: $1 \times 10^{19}$ | 400 |
| | Subcollector-2 | InP | Si: $3 \times 10^{19}$ | 5000 |
| | Subcollector-3 | InGaAs | Si: $1 \times 10^{19}$ | 200 |
| Substrate 300 | | InP | | |

Note that, while Table 1 lists a particular set of materials having a particular set of doping levels and thicknesses for exemplary purposes, any selection of materials, doping levels, thicknesses (and transition layers) can be used that provides a desired HBT functionality.

For example, while the material for substrate 300 is listed as being InP, according to various other embodiments of the invention, substrate 200 can be formed from other materials compatible with group III-V materials. Likewise, base layer 230 could be formed from gallium arsenide antimonide (GaAsSb) rather than the listed InGaAs, while emitter layer 240 could be formed from InAlAs or any other high bandgap material lattice matched to base layer 230.

Furthermore, transition regions 235, 245, and 255 can include various other layer structures and/or materials, depending on the desired effect of such transition regions. For example, the sample HBT layer structure described in Table 1 lists transition region 235 as including a p setback, an n setback, and a bandgap grade, which would provide a more gradual bandgap gradient between base layer 230 and collector layer 220. Alternative transition structures and materials will be readily apparent. For example, the bandgap grade could be formed from indium gallium arsenide phosphide (InGaAsP), an InP superlattice, or an InAlAs superlattice.

Also, any individual layer could comprise multiple "sublayers". For example, Table 1 lists subcollector layer 210 as being formed from three layers (subcollector-1, subcollector-2, and subcollector-3). In this case, the thicker InP subcollector-2 layer provides enhanced thermal conductivity. According to other exemplary embodiments of the invention, different sub-layer structures can be implemented for other reasons. Note that all of the aforementioned material selections are not intended to be a comprehensive listing of options, but are simply examples of various options.

Figure 3B:
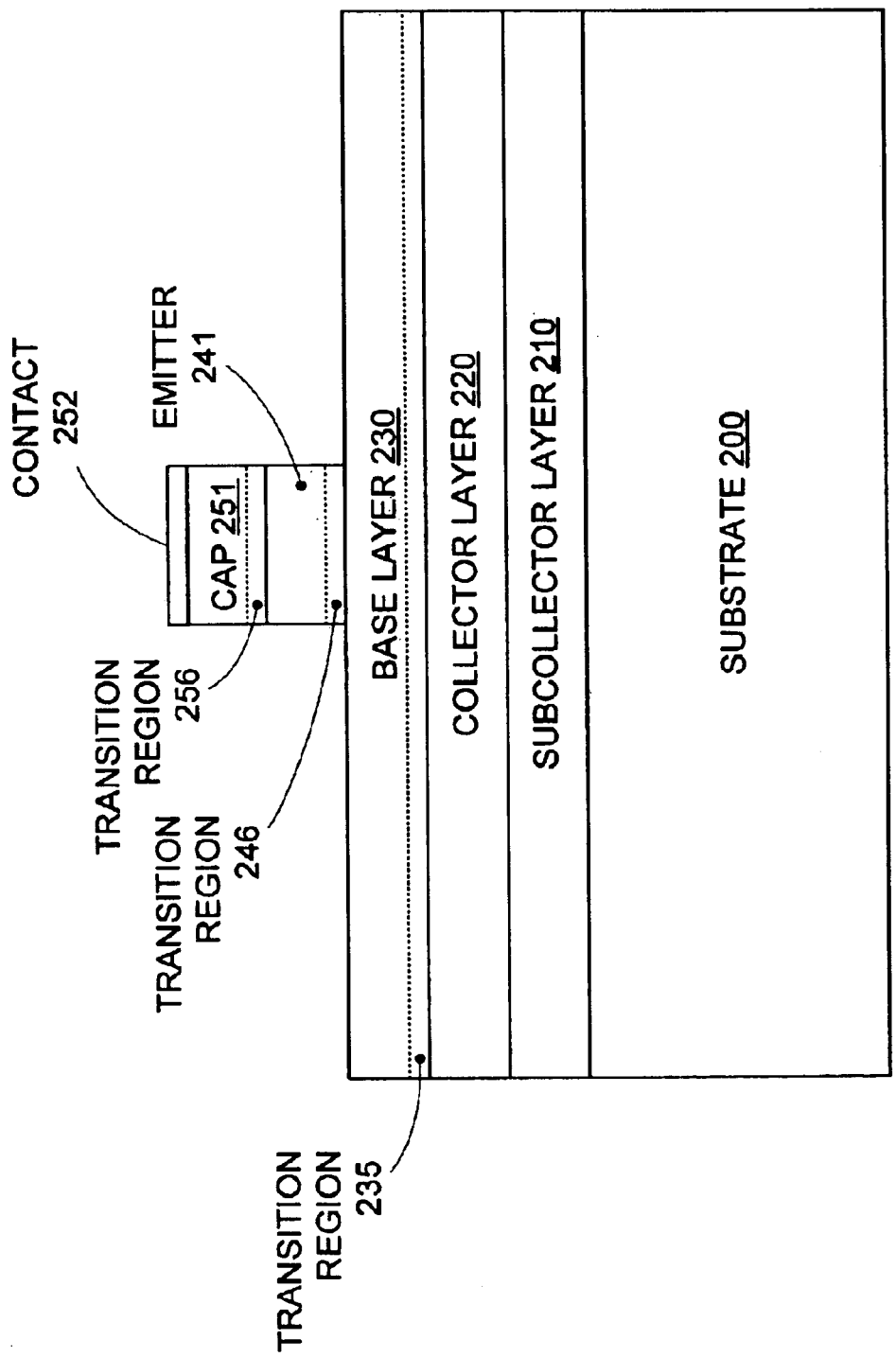

FIG. 3B shows a cross sectional view of the HBT layer structure after formation of an emitter 241. Optional cap layer 250 and emitter layer 240 shown in FIG. 2A have been etched to form an optional emitter cap 251 stacked over emitter 241, respectively. An optional emitter contact 252 could be formed on emitter cap 251 before or after this etch process.

Note that, if the original HBT layer structure included transition regions 255 and 245, the transition layers in those regions could also have been etched to form corresponding transition regions 256 (below cap 251) and 246 (below emitter 241), respectively. According to various other embodiments of the invention, transition region 245 could be part of base layer 230, and so would not be etched during emitter formation (and instead would be etched during base formation).

Figure 3C:
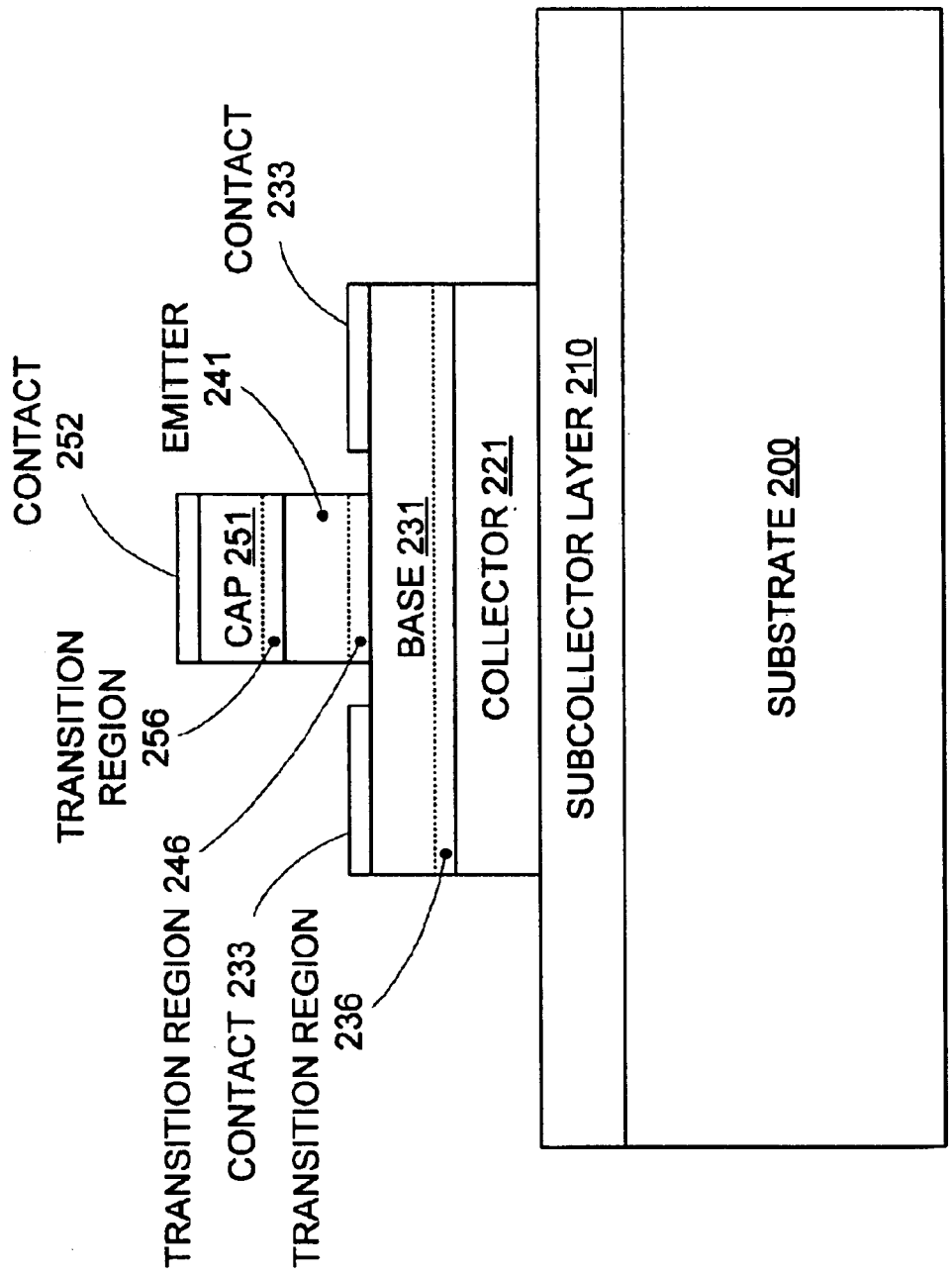

FIG. 3C shows a cross sectional view of the HBT layer structure after formation of a base 231 and a collector 221.

Base layer 230 and collector layer 220 shown in FIGS. 3A and 3B have been etched to form base 231 stacked over collector 221, respectively. Typically, the base and collector for an HBT would be formed during the same etch process, but according to other embodiments of the invention, base 231 and emitter 232 could have been formed in successive process steps. If the original HBT layer structure included transition region 235, the transition layer(s) in that region would also be etched to form a transition region 236 between base 231 and collector 221.

Note that the relative positions of base 231 and collector 221 in this base-collector stack are determined by the order of base layer 230 and collector layer 220 in the original HBT layer structure 290 (shown in FIG. 3A). In the exemplary embodiment of the invention described with respect to FIGS. 3A–3E, the base-collector stack includes a base positioned above the collector.

Optional base contact(s) 233 could be formed on base 231 before or after the etch process used to form base 231. Similarly, although not shown for clarity, optional collector contacts could be formed on collector 221 if necessary (assuming appropriate collector geometry), either before or after the etch process used to form collector 221.

Figure 3D:
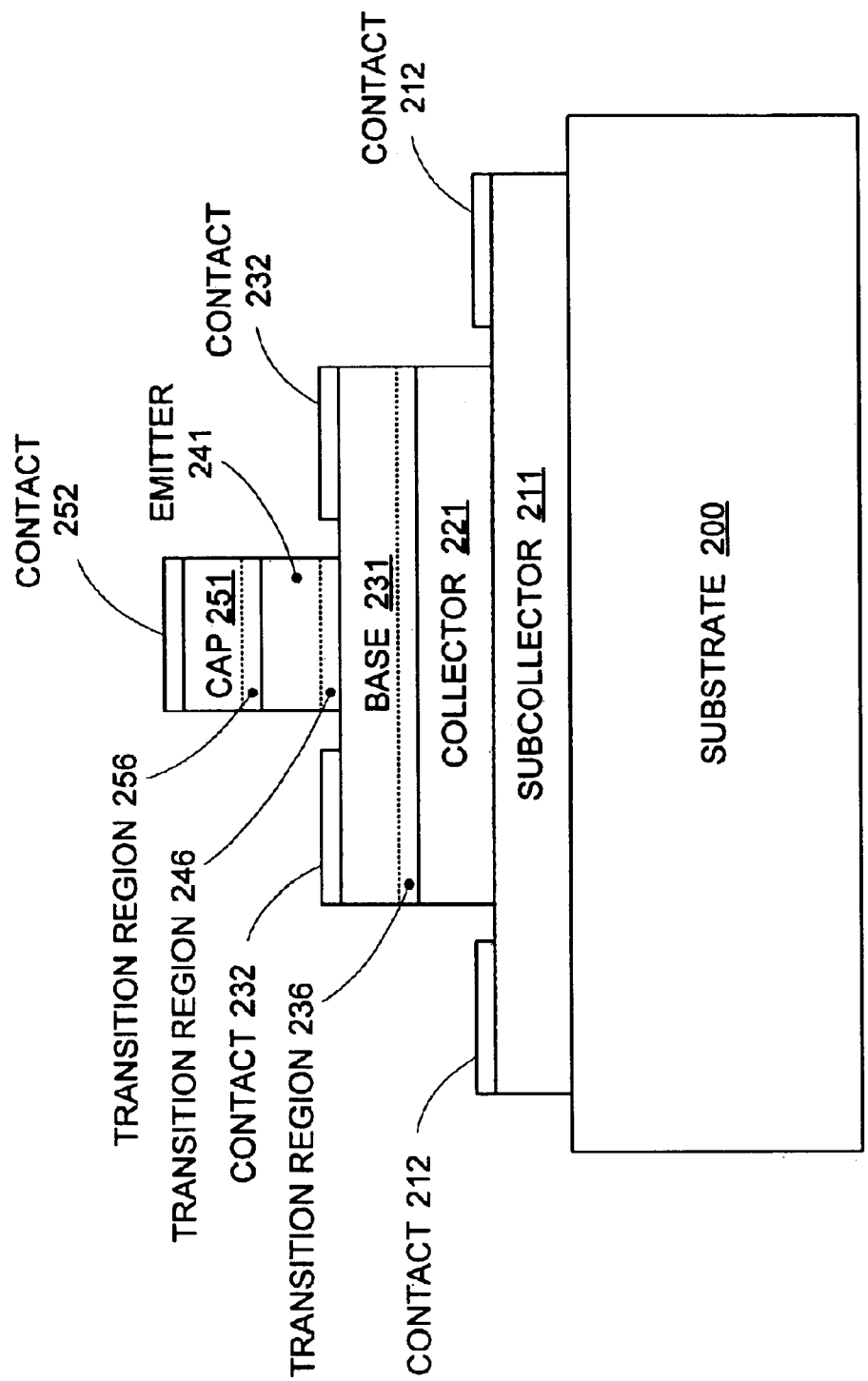

FIG. 3D shows a cross sectional view of the HBT layer structure after formation of a subcollector 211. HBTs typically include a subcollector that is more highly doped than the collector so that better electrical contact can be made with metal interconnects and contacts. Subcollector layer 210 shown in FIGS. 3A, 3B, and 3C has been etched to form subcollector 211. Optional collector contact(s) 212 can be formed on subcollector 211 before or after the etch process used to form subcollector 211. Note that at this stage, all the HBT components for HBT 201 have been formed.

Figure 3E:
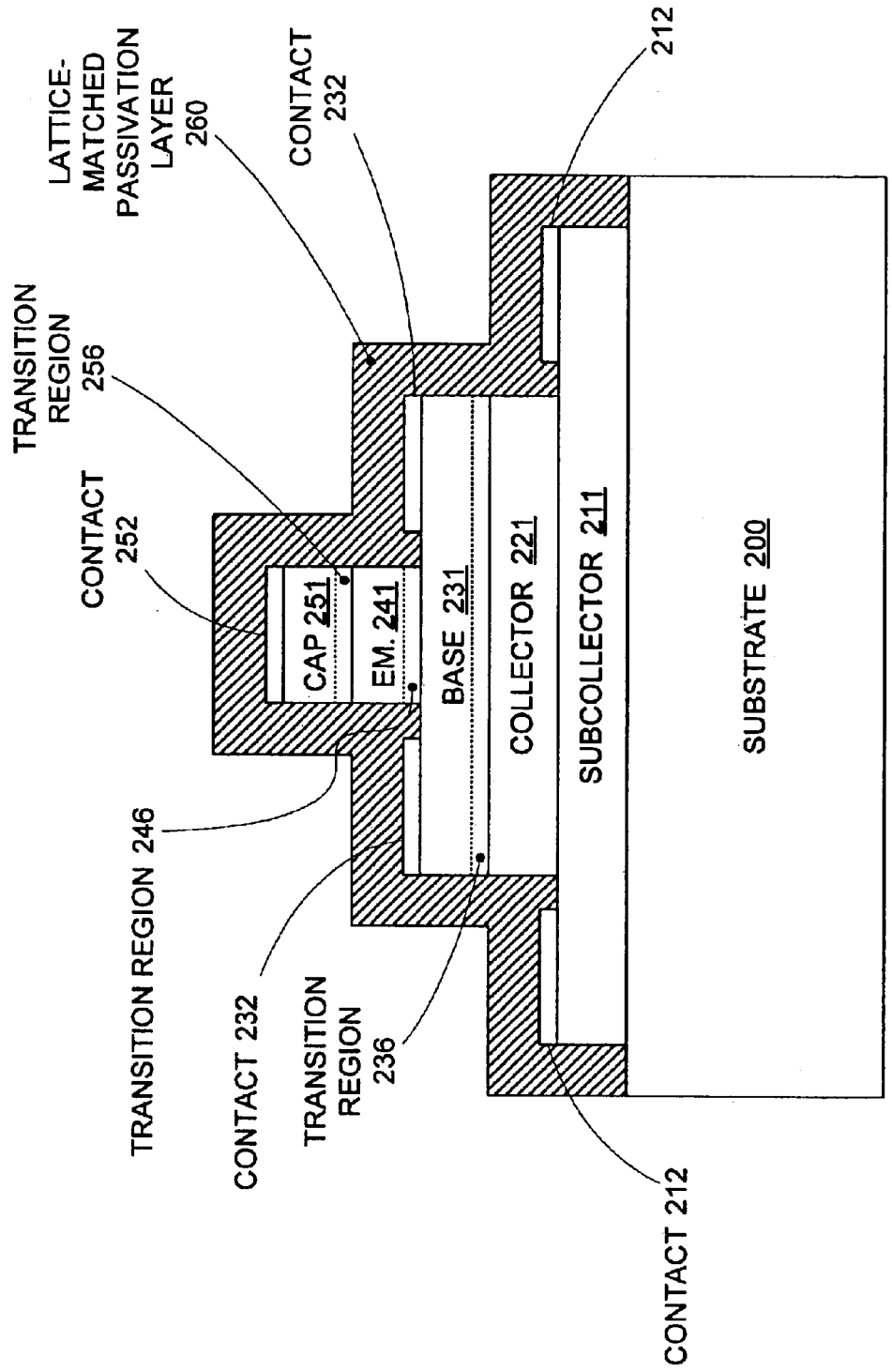

Finally, FIG. 3E shows a cross sectional view of the HBT components passivated by a lattice-matched passivation layer 260. As described above, lattice-matched passivation layer 260 can comprise any material that has a bandgap higher than the bandgaps of base 231 and collector 221 (and subcollector 211, emitter 241, and cap 251, as necessary). Passivation layer 260 can comprise any crystalline structure (e.g., epitaxial, polycrystalline), so long as it is lattice matched with the underlying device components. Interconnects can be formed through vias in passivation layer 260 to produce the wired HBT 201 shown in FIG. 2A.

Figure 4:
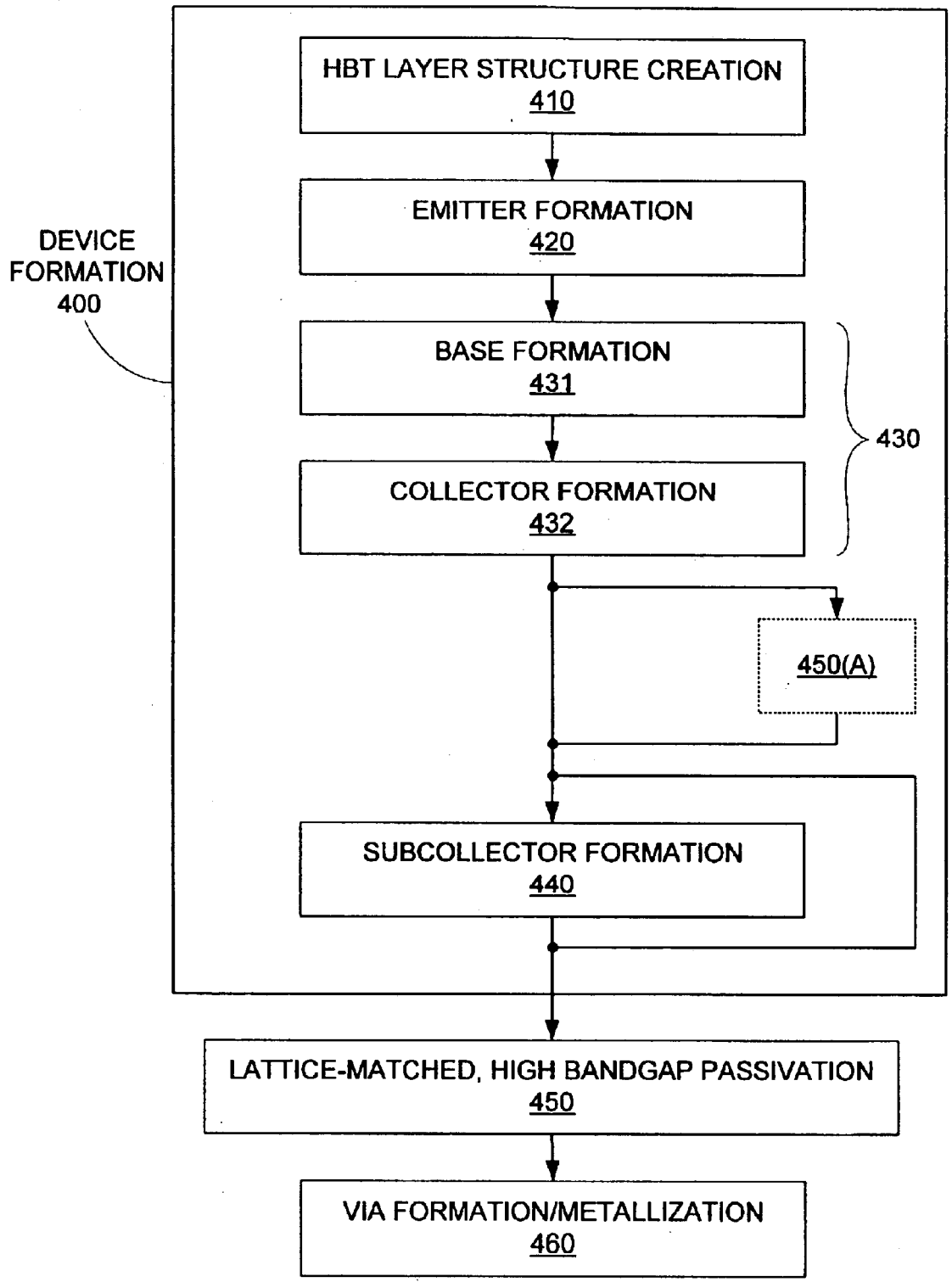
FIG. 4 is a flow diagram of a manufacturing process for a semiconductor device having a lattice-matched, high bandgap passivation layer, according to an embodiment of the invention.

FIG. 4 shows a flowchart for the formation of a group III-V device that includes a lattice-matched, high bandgap passivation layer, according to an embodiment of the invention. In a "DEVICE FORMATION" step 400, the device is formed using the particular steps required to produce that particular device. As an example, step 400 is described in detail below with respect to the steps required to produce a HBT. Note, however, that step 400 can include various other combinations of process steps depending on the actual device being formed.

In an "HBT LAYER STRUCTURE CREATION" step 410, the HBT layer structure from which the final HBT will be formed is provided (e.g., as shown in FIG. 3A). As noted above, the HBT layer structure can comprise any number of layers and any combination of layer materials that will provide the desired final HBT composition.

Next, in an "EMITTER FORMATION" step 420, the emitter for the HBT and any associated emitter cap and/or transition layers is formed from the HBT layer structure (e.g., as shown in FIG. 3B). An optional emitter contact can also be formed on the emitter during step 420. Then, the base and collector for the HBT (and any associated transition layers) are etched from the HBT layer structure in a "BASE FORMATION" step 431 and a "COLLECTOR FORMATION" step 432, respectively (e.g., as shown in FIG. 3C).

Note that according to another embodiment of the invention, the base and collector can be formed in a single etch process, as indicated by step 430 (bracketing steps 431 and 432). Note further that optional base and collector contacts can be formed during steps 431 and 432, respectively, or during step 430.

If the final HBT includes a subcollector (to provide collector contacts and isolation), the subcollector can then be formed from the HBT layer structure in an optional "SUBCOLLECTOR FORMATION" step 440 (e.g., as shown in FIG. 3D). Optional subcollector contacts can also be formed on the subcollector during step 440.

Once device formation is complete, the group III-V device is passivated in a "LATTICE-MATCHED, HIGH BANDGAP PASSIVATION" step 450. As described above, the passivation layer can comprise any material that can be lattice-matched to the desired exterior surfaces of the device and has a higher bandgap than the materials being passivated. The selection of a passivation layer material that has a higher (wider) bandgap than the device components being passivated prevents charge carriers from passing through the passivation layer, thereby ensuring proper device performance. Meanwhile, the lattice-matching of the passivation layer to the exterior surfaces being passivated creates a robust bond that prevents thermally induced surface leakage currents from developing.

The lattice-matched high bandgap passivation layer can be formed using any desired process technology compatible with the material selected for the passivation layer and the exterior device surfaces being passivated, such as CVD, hot wall epitaxy, molecular beam epitaxy, or vacuum sputter deposition, among others. For example, according to an exemplary embodiment of the invention, an InAlAs passivation layer for an InP or InAlAs HBT can be grown using a metal organic chemical vapor deposition (MOCVD) tool. A sample process recipe could then comprise a 540° C. deposition using trimethyl-aluminum (TMAl), trimethyl-indium (TMIn) and arsine (AsH3) as source precursors and hydrogen gas as the carrier gas to produce a 50 nm InAlAs passivation layer. Other process recipes (for InAlAs and other materials) are well known in the art.

According to another exemplary embodiment of the invention, passivation step 450 can include a cleaning operation prior to the formation of the passivation layer to enhance passivation layer and bond quality. For example, an InP or InAlAs HBT can undergo a pre-passivation cleaning operation that includes a five minute buffered hydrofluoric (BHF) acid dip followed by a water rinse and a nitrogen dry. Other cleaning operations are well known in the art, and different semiconductor fabrication facilities will have different cleaning processes. Any cleaning operation can be used that properly prepares the surfaces to be passivated (e.g., the exterior base and collector surfaces of a HBT) to accept the lattice-matched, high bandgap passivation layer.

Note that, according to an exemplary embodiment of the invention, since step 450 is performed after all of the device components have been formed (e.g., the emitter, base, collector, optional cap and optional subcollector for a HBT), the entire device could be passivated by the lattice-matched high bandgap passivation layer. Note that the bandgap of the passivation layer would then be selected to be higher than the bandgaps of all the device components (e.g., the base, the collector (including the subcollector), and the emitter (including the emitter cap) in a HBT) to ensure proper device function.

According to another exemplary embodiment of the invention, only selected exterior surfaces of the device could be passivated by the lattice-matched high bandgap passivation layer. In such a case, passivation step could be performed immediately after formation of those exterior surfaces. For example, if only the base and collector exterior surfaces of an HBT are to be passivated by the lattice-matched high bandgap passivation layer, that passivation operation could be performed at the point indicated by step 450(A) (dotted outline).

Once the passivation layer is formed, the device is wired in a "VIA FORMATION/METALLIZATION" step 460. Vias are formed in the passivation layer, and metal or other electrically conductive interconnects are created in those vias, thereby allowing electrical connections to be made to the various device components through the passivation layer (e.g., as shown in FIG. 2A).

According to an exemplary embodiment of the invention, contacts for the device components (e.g., the emitter, base, and collector (or subcollector) contacts described above with respect to steps 420, 431, and 432 (or 440), respectively) can be formed before passivation step 450, as long as those contacts can withstand the subsequent passivation temperatures. According to another exemplary embodiment of the invention, all contacts can be formed after passivation (through the passivation layer).

As noted above, the specific steps and structures described with respect to FIGS. 3A–3E and 4 are merely exemplary. Various other embodiments of the invention will be readily apparent. For example, FIGS. 5A–5D depict various stages in a process for creating a group III-V device having a similar material composition but different structure than the group III-V device 201 shown in FIG. 2A, according to another exemplary embodiment of the invention.

Figure 5A:
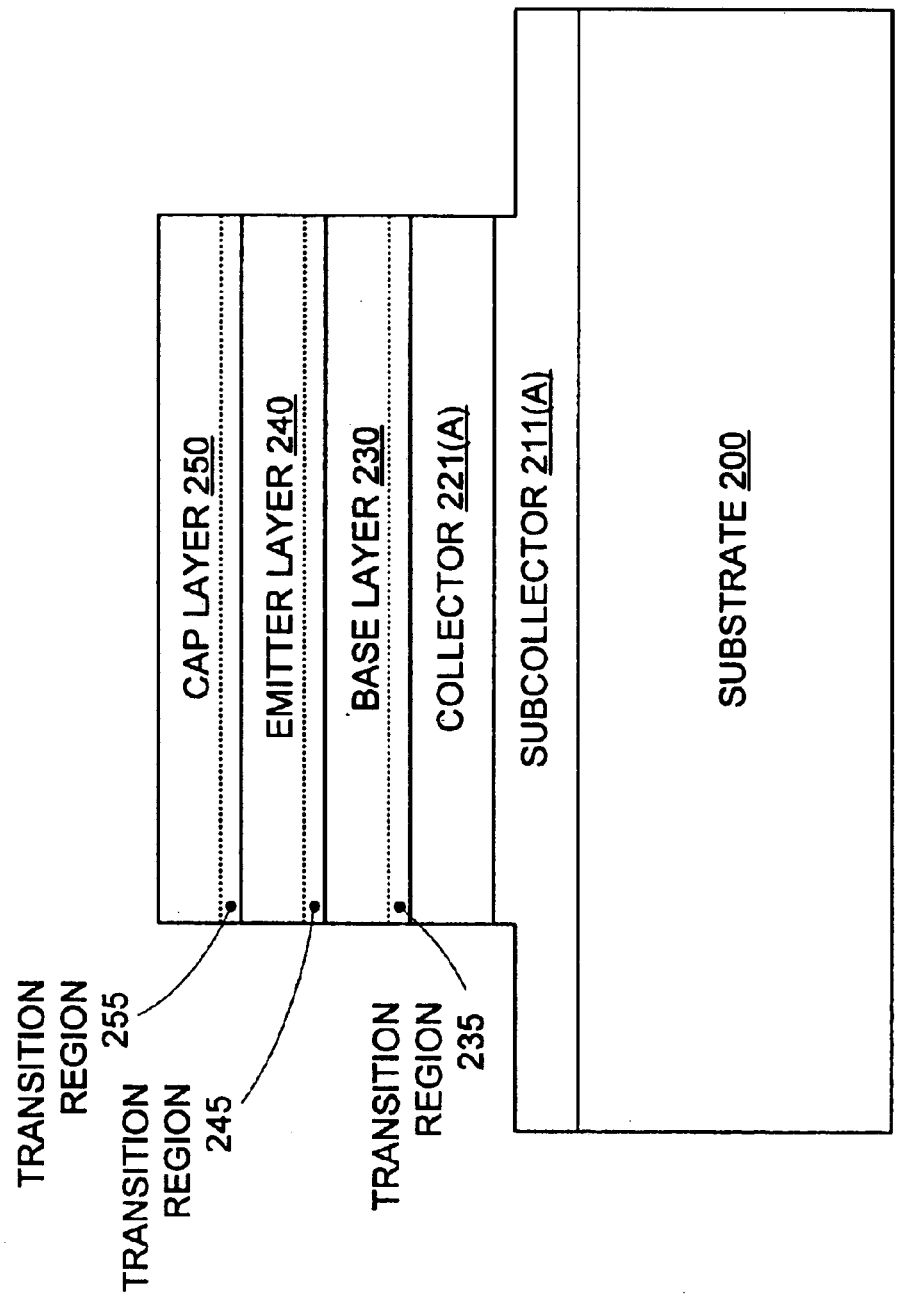
FIGS. 5A, 5B, 5C, and 5D are cross sectional views of different stages in a manufacturing process for a HBT having a lattice-matched, high bandgap passivation layer, according to another embodiment of the invention.
Figure 5B:
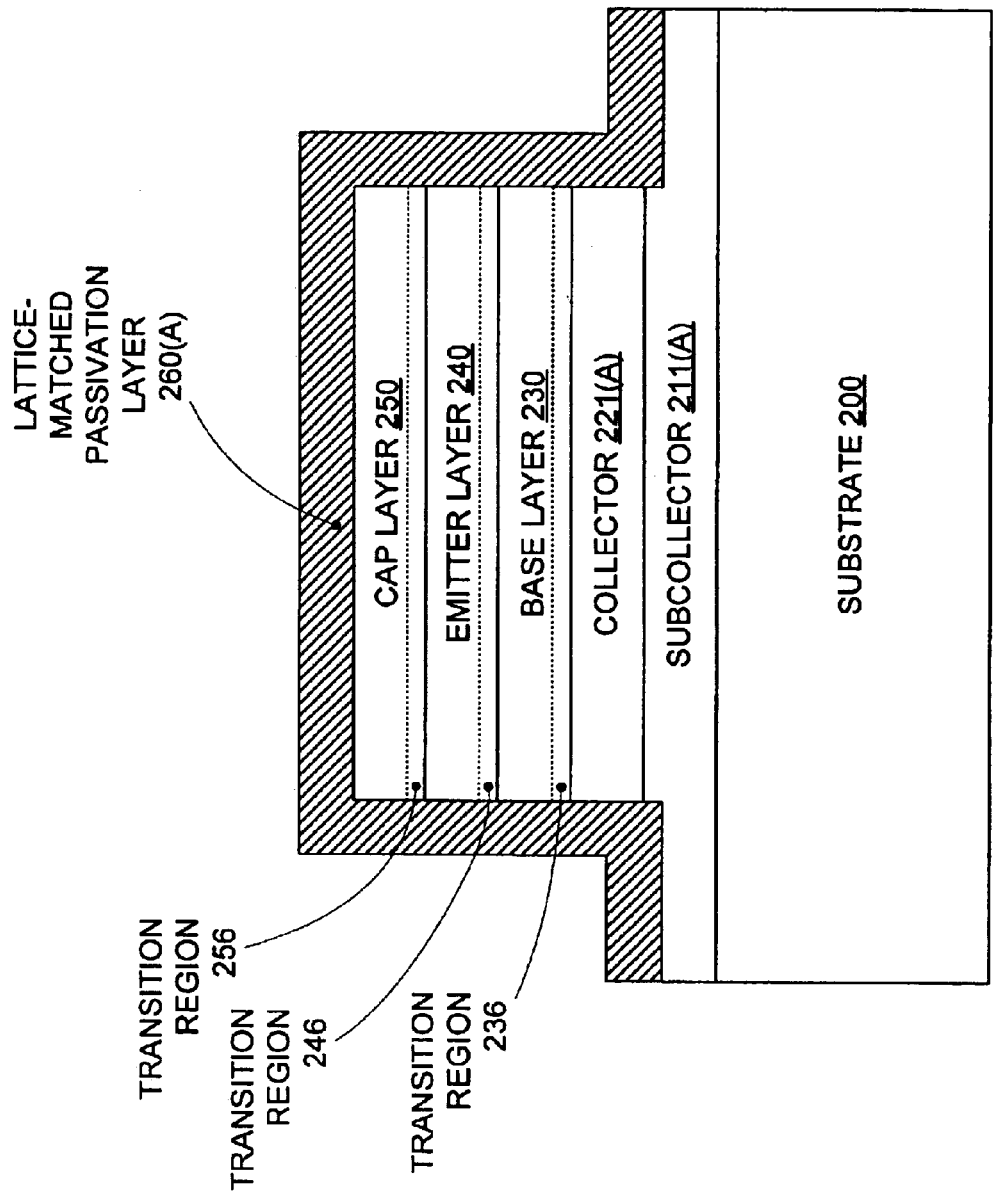

Starting from the HBT layer structure 290 shown in FIG. 3A, the HBT layer structure is etched down to subcollector layer 210 to form a collector 221(A) and a subcollector 211(A), as shown in FIG. 5A. Then, as shown in FIG. 5B, a lattice-matched, high bandgap passivation layer 260(A) is used to passivate the exterior surfaces of the etched structure. Like passivation layer 260 shown in FIG. 3E, passivation layer 260(A) can comprise any material that has a bandgap higher than the bandgaps of the underlying materials, and can comprise any crystalline structure (e.g., epitaxial, polycrystalline), so long as it is lattice matched with the underlying device components.

Figure 5C:
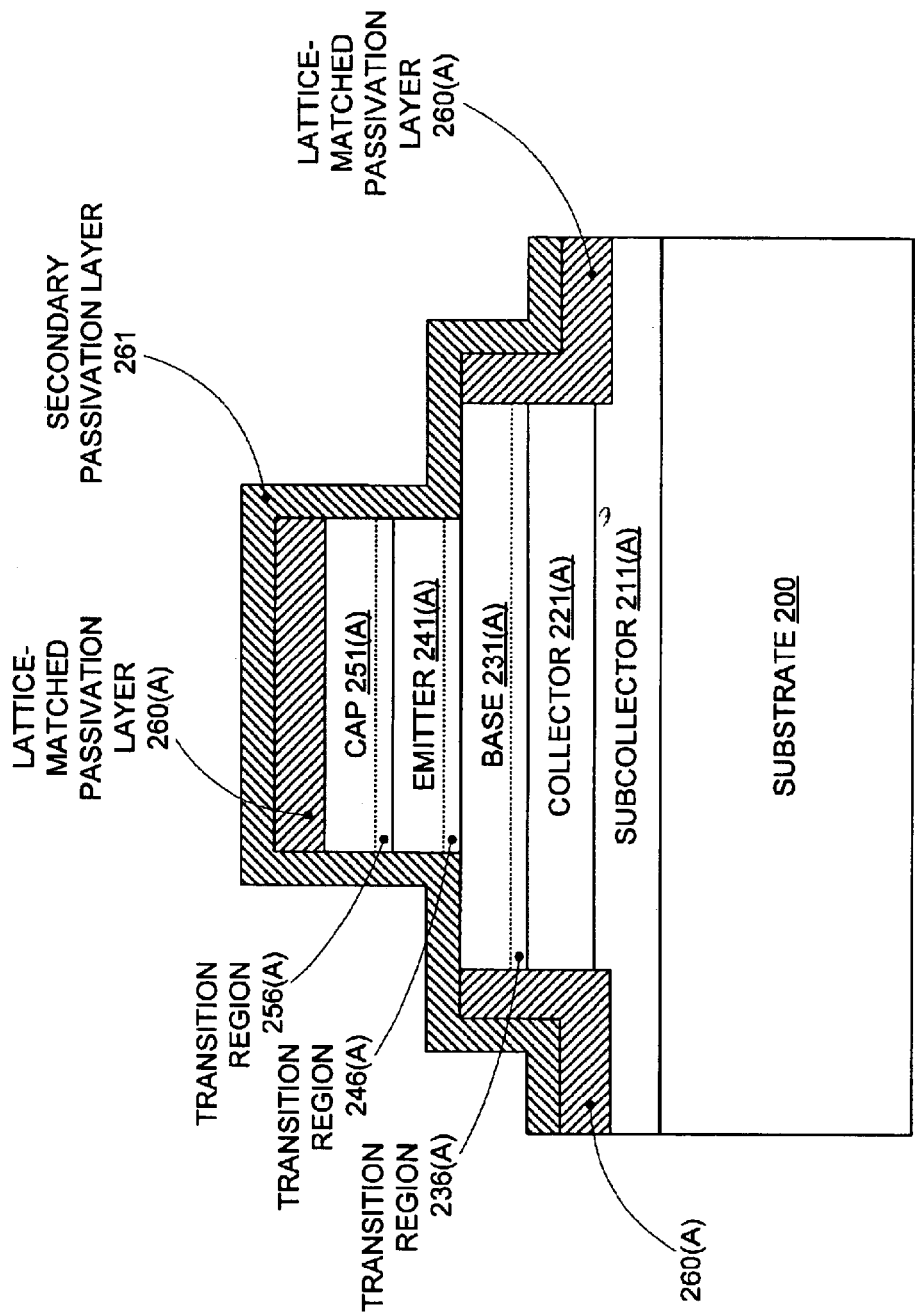

Then, passivation layer 260(A), cap layer 250, and emitter layer 240 are etched through to base layer 230. This etch operation therefore defines a cap 251(A), an emitter 241(A), and a base 231(A) for the final HBT, as shown in FIG. 5C. Note that this etch operation can also define transition regions 236(A), 246(A), and 256(A), which are substantially similar to transition regions 236, 246, and 256, respectively, which are described above with respect to FIGS. 2A, 3C, and 3D.

A secondary passivation layer 261 is then formed over the exterior surfaces of the components exposed by the etch process. Note that the formation of base 231(A) does not expose (reveal) any additional exterior surfaces of collector 221(A), so no new current paths for leakage currents between base 231(A) and collector 221(A) are created. Therefore, secondary passivation layer 261 does not need to be a lattice-matched passivation layer (for the purposes of B-C leakage current prevention).

Figure 5D:
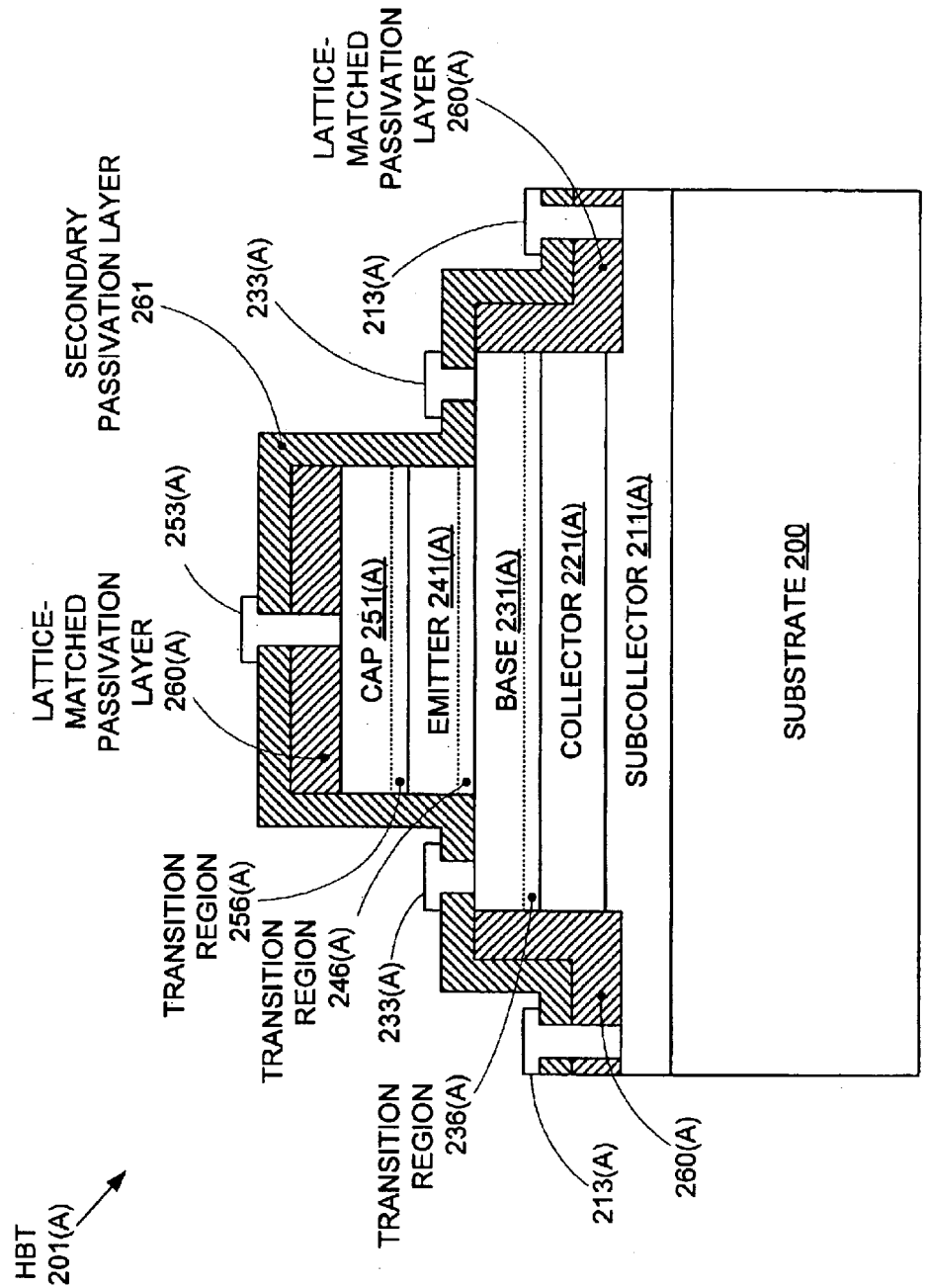

Finally, as shown in FIG. 5D, a wired HBT 201(A) is completed by forming interconnects 213(A), 233(A), and 253(A) through the passivation layers to provide electrical contacts to collector 221(A) (via subcollector 211(A)), base 231(A), and emitter 241(A) (via emitter cap 251(A)), respectively. The robust bond formed between lattice-matched passivation layer 260(A) and the (coplanar) sidewalls of base 231(A) and collector 221(A) prevents the formation of dangling bonds along those sidewalls that would otherwise allow surface leakage currents to flow.

Figure 6:
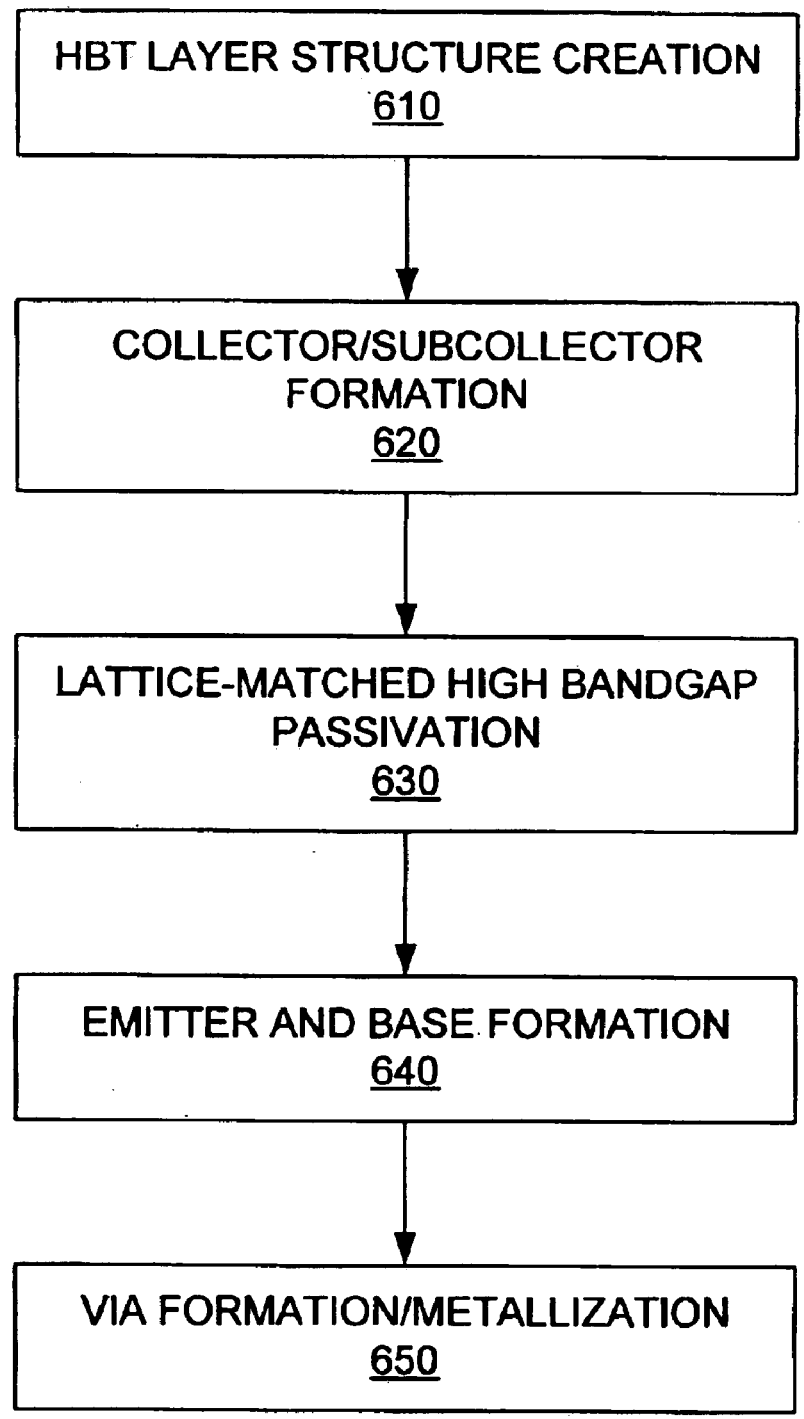
FIG. 6 is a flow diagram of a manufacturing process for a HBT having a lattice-matched, high bandgap passivation layer, according to another embodiment of the invention.

FIG. 6 shows 4 shows a flowchart summarizing the steps depicted in FIGS. 5A–5D. In a "HBT LAYER STRUCTURE CREATION" step 610, the HBT layer structure shown in FIG. 3A is provided. Then, in a "COLLECTOR/SUBCOLLECTOR FORMATION" step 620, the HBT layer structure is etched all the way down to the subcollector as shown in FIG. 5A. Next, in a "LATTICE-MATCHED HIGH BANDGAP PASSIVATION" step 630, the lattice-matched, high bandgap passivation layer is formed over the exposed exterior surfaces of the HBT components, as shown in FIG. 5B.

The passivation layer and emitter (and cap) layers are then etched through to the base layer to form the base and emitter of the HBT in an "EMITTER AND BASE FORMATION" step 640, as shown in FIG. 5C. The exterior surfaces of the HBT exposed by this etch process are passivated, although as noted above, this secondary passivation layer need not be lattice-matched to the underlying structures since no base-collector current paths are formed by the etch operation depicted in FIG. 5C. Finally, in a "VIA FORMATION/METALLIZATION" step 650, the conductive interconnects for wiring the HBT are formed through the lattice-matched passivation layer (for the collector and emitter) and through the secondary passivation layer (for the base), as shown in FIG. 5D.

The various embodiments of the structures and methods of this invention that are described above are illustrative only of the principles of this invention and are not intended to limit the scope of the invention to the particular embodiments described. For example, the group III-V device formed by device formation step 400 in FIG. 4 could comprise a diode, in which case the high bandgap lattice-matched passivation layer could be formed over the anode and cathode of the diode, thereby preventing surface leakage currents between the anode and cathode. Thus, the invention is limited only by the following claims and their equivalents.

What is claimed is:

1. A method for creating a semiconductor device, the method comprising:
    providing a heterojunction bipolar transistor (HBT) comprising an emitter, a base, and a collector; and
    passivating the base and the collector with a first material, the step of passivating causing the first material to be lattice-matched to the base and the collector,
    wherein the base has a first bandgap,
    wherein the collector has a second bandgap, and
    wherein the first material has a third bandgap, the third bandgap being higher than the first bandgap and the second bandgap.

2. A method for creating a semiconductor structure, the method comprising:
    providing a group III-V device having a plurality of exterior surfaces, the group III-V device comprising a first component and a second component, the first component providing a first portion of the plurality of exterior surfaces, and the second component providing a second portion of the plurality of exterior surfaces; and passivating the first portion and the second portion with a first passivation layer, the passivation layer being lattice matched to the first component and the second component, wherein the first component has a first bandgap, wherein the second component has a second bandgap, wherein the first passivation layer has a third bandgap, the third bandgap being higher than the first bandgap and the second bandgap, and wherein the group III-V device comprises a heterojunction bipolar transistor (HBT), the first component comprises a base and the second component comprises a collector.

3. The method of claim 1, wherein the group III-V device further comprises an indium phosphide emitter, and wherein the first passivation layer comprises indium aluminum arsenide.

4. The method of claim 1, wherein the step of passivating further comprises passivating all of the plurality of exterior surfaces with the first passivation layer.

5. The method of claim 1, wherein the group III-V device further comprises an indium aluminum arsenide (InAlAs) emitter, wherein the passivation layer comprises InAlAs, and wherein step of passivating further comprises passivating the plurality of exterior surfaces other than the first portion and the second portion with a second passivation layer, the second passivation layer not including InAlAs.

6. The method of claim 1, wherein the passivating step further comprises passivating all of the plurality of exterior surfaces with the first passivation layer, wherein group III-V device further includes an emitter having a fourth bandgap, and wherein the third bandgap is higher than the fourth bandgap.

7. The method of claim 1, wherein the emitter includes an emitter cap, the emitter cap having a fifth bandgap, and wherein the third bandgap is higher than the fifth bandgap.

8. The method of claim 1, wherein the group III-V device further comprises a subcollector in contact with the collector, the subcollector having a fifth bandgap, wherein the third bandgap is higher than the fifth bandgap.

9. The method of claim 1, wherein the group III-V device further comprises a plurality of metal contacts, each of the plurality of metal contacts providing an electrical contact for one of the emitter, the base, and the collector, the plurality of metal contacts providing a third portion of the plurality of exterior surface, wherein the step of passivating further comprises passivating the third portion with the first passivation layer.

10. The method of claim 1, further comprising:

forming a plurality of electrically conductive interconnects through the first passivation layer, each of the plurality of electrically conductive interconnects making an electrical contact with one of the emitter, the base, and the collector.

11. The method of claim 1, wherein the step of passivating further comprises:

performing a cleaning operation to prepare the first portion of the plurality of exterior surfaces and the second portion of the plurality of exterior surfaces for passivation.

* * * * *